(12) United States Patent
Nakaya et al.

(10) Patent No.: US 10,350,756 B2
(45) Date of Patent: Jul. 16, 2019

(54) METHOD OF AUTOMATICALLY AVOIDING OBSTACLE FOR ARM ROBOT AND CONTROL DEVICE

(71) Applicant: KAWASAKI JUKOGYO KABUSHIKI KAISHA, Kobe-shi, Hyogo (JP)

(72) Inventors: Atsushi Nakaya, Akashi (JP); Masaya Yoshida, Himeji (JP); Shohei Mase, Kakogawa (JP); Hiroki Takahashi, Akashi (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 234 days.

(21) Appl. No.: 15/539,838

(22) PCT Filed: Dec. 25, 2014

(86) PCT No.: PCT/JP2014/006475
§ 371 (c)(1),
(2) Date: Jun. 26, 2017

(87) PCT Pub. No.: WO2016/103297
PCT Pub. Date: Jun. 30, 2016

(65) Prior Publication Data
US 2017/0348856 A1  Dec. 7, 2017

(51) Int. Cl.
*G05B 19/18* (2006.01)
*B25J 9/16* (2006.01)
(Continued)

(52) U.S. Cl.
CPC .............. *B25J 9/1666* (2013.01); *B25J 9/06* (2013.01); *B25J 9/1664* (2013.01); *H01L 21/68707* (2013.01)

(58) Field of Classification Search
None
See application file for complete search history.

(56) References Cited

U.S. PATENT DOCUMENTS

2010/0168950 A1    7/2010  Nagano

FOREIGN PATENT DOCUMENTS

| CN | 102819264 A | 12/2012 |
|---|---|---|
| JP | S61-134807 A | 6/1986 |

(Continued)

OTHER PUBLICATIONS

Apr. 7, 2015 Search Report issued in International Patent Application No. PCT/JP2014/006475.
(Continued)

*Primary Examiner* — Bhavesh V Amin
(74) *Attorney, Agent, or Firm* — Oliff PLC

(57) ABSTRACT

Method of automatically avoiding an obstacle for a robot including a geometric model expression step, an area setting step, a final posture deciding step, an initial route deciding step, a virtual posture calculation step, an interference determining step, a way-point posture deciding step that decides the virtual posture as a way-point posture; and when the geometric model is determined to interfere with the no-entry area, virtually generates a repulsive force for relatively repelling an interfering portion of the geometric model from an interfering portion of the no-entry area, calculates a posture in a state where the interfering portion of the model is pushed from the no-entry area into the operating area by the repulsive force, and decides the calculated posture as a way-point posture; an updated route deciding step, and a step repeatedly performing the steps from the initial route deciding step to the updated route deciding step.

7 Claims, 13 Drawing Sheets

(51) Int. Cl.
*B25J 9/06* (2006.01)
*H01L 21/687* (2006.01)

(56) References Cited

FOREIGN PATENT DOCUMENTS

| | | |
|---|---|---|
| JP | H07-028520 A | 1/1995 |
| JP | H09-207089 A | 8/1997 |
| JP | 2003-136466 A | 5/2003 |
| JP | 2008-254141 A | 10/2008 |
| JP | 2009-090383 A | 4/2009 |
| JP | 2010-094765 A | 4/2010 |
| JP | 2010-155328 A | 7/2010 |
| JP | 2010-188437 A | 9/2010 |
| JP | 2011-518677 A | 6/2011 |
| JP | 2012-006100 A | 1/2012 |
| JP | 2012-216151 A | 11/2012 |
| JP | 2014-034107 A | 2/2014 |

OTHER PUBLICATIONS

Apr. 7, 2015 Written Opinion issued in International Patent Application No. PCT/JP2014/006475.

METHOD OF AUTOMATICALLY AVOIDING OBSTACLE FOR ARM ROBOT AND CONTROL DEVICE

TECHNICAL FIELD

The present invention relates to a method of automatically avoiding an obstacle for an arm robot and a control device.

BACKGROUND ART

Conventionally, methods of automatically avoiding interference of a robot which is stopped with obstacles and allowing the robot to reach a given posture are known.

Patent Document 1 discloses a method of backtracking a path to return to the task origin. Specifically, it is a control method of returning a robot which performs a series of operations along a desired path by sequentially executing a control program described including movement commands, to a task origin from a stopped position. Upon reversely executing the already-executed control program sequentially, each movement command is executed using a positional argument of the last movement command.

Patent Document 2 discloses a robot which can return to the origin even when the robot stops abnormally outside a movement path. Specifically, it includes an area-block creation process for dividing an area map including at least an operating area where the robot operates into area blocks having a given area, and a direction setting process for setting a returning direction of the robot for every area block divided. Thereby, interference with obstacles is avoidable.

REFERENCE DOCUMENTS OF CONVENTIONAL ART

Patent Documents

[Patent Document 1] JP1995-028520A
[Patent Document 2] JP2009-090383A

DISCLOSURE OF THE INVENTION

Problems to be Solved by the Invention

In the method disclosed in Patent Document 1, when the robot stops abnormally outside the movement path, the robot cannot return to the task origin. On the other hand, it is possible in the method of Patent Document 2. However, in the method disclosed in Patent Document 2, the returning direction of the robot needs to be set beforehand for every area block and, thus, there is a problem that a workload of a worker who performs the setting increases. In addition, there is a problem that a decision of the returning direction requires a determination by the rule of thumb of the worker, and such a worker is difficult to secure. Furthermore, there is a problem that data where the returning direction of the robot is set for every area block is huge in the data size. In other words, there is a problem that complicated settings are required for the returning direction of the robot.

The present invention is made in view of the problems described above, and aims at providing a method of automatically avoiding an obstacle for a robot, and a control device, which allow the robot to reach a given posture safely with a simple setting even if the robot stops at any position.

SUMMARY OF THE INVENTION

In order to solve the above problems, according to one aspect of the present invention, a method of automatically avoiding an obstacle for an arm robot having a robotic arm to which a plurality of links are coupled by joints and to which a hand is provided in a tip-end part thereof is provided, which includes modeling the robot so as to have a geometric shape and expressing the model as a geometric model, setting a no-entry area into which the geometric model is not to enter and an operating area, that is defined by the no-entry area and where the geometric model operates, deciding a final posture of the robot, deciding an initial route of the hand when the robot changes from the current posture toward the final posture, calculating a virtual posture of the robot corresponding to a given point on the initial route, determining whether the geometric model in the virtual posture interferes with the no-entry area, deciding, when the determining the interference determines that the geometric model does not interfere with the no-entry area, the virtual posture as a way-point posture, and when the determining the interference determines that the geometric model interferes with the no-entry area, virtually generating a repulsive force for relatively repelling an interfering portion of the geometric model from an interfering portion of the no-entry area, calculating a posture in a state where the interfering portion of the geometric model is pushed out from the no-entry area into the operating area by the virtual repulsive force, and deciding the calculated posture as a way-point posture, deciding a route of the hand when the posture changes from the current posture to the final posture via the way-point posture, as an updated route, and repeatedly performing the deciding the initial route, the calculating the virtual posture, the determining the interference, the deciding the way-point posture, and the deciding the updated route, under an assumption of the latest way-point posture decided in the deciding the way-point posture being a current posture in the deciding the initial route.

According to the above configuration, the method calculates the virtual posture of the robot corresponding to the given point on the initial route of the hand when the robot changes from the current posture toward the final posture, and determines whether the geometric model of the robot in the virtual posture interferes with the no-entry area (obstacles). If it is determined that the model does not interfere with the no-entry area, the virtual posture is decided as the way-point posture via which the posture changes from the current posture toward the final posture, and on the other hand, if it is determined that the model interferes with the no-entry area, the posture in the state where the interfering portion of the geometric model is pushed out from the no-entry area into the operating area by the virtual repulsive force is calculated, and is decided as the way-point posture. Therefore, since the way-point posture which does not interfere with the no-entry area is given when the geometric model of the robot interferes with the no-entry area, a collision with the obstacle is avoided. Note that, the posture deviates from the original initial route in this case, thus it cannot be secured to approach the final posture. On the other hand, since the way-point posture corresponding to the point on the initial route is given when the geometric model of the robot does not interfere with the no-entry area, the posture approaches the final posture. According to the configuration described above, since the procedure is repeated by using the newly-given way-point posture as the current posture, the way-point posture corresponding to the point on the initial route in the current procedure is given and the posture approaches the final posture each time a procedure in which the geometric model of the robot does not interfere with the no-entry area appears. Therefore, by repeating the trial and error, the updated route of the hand when the robot changes from the current posture to the final posture while avoiding the collision with the obstacle is finally acquired.

As a result, the simple settings of the geometric model of the robot, the no-entry area, and the operating area enable the automatic avoidance of the interferences with obstacles even if the robot stops at any position, and allow the robot to safely reach the given posture (e.g., a retreated posture).

The deciding the final posture may include selecting from the plurality of final posture candidates of the robot set on a known route and deciding as the final posture, a final posture candidate of which a sum total of absolute values of displacements in an angle of each of the joints between the current posture and the final posture candidate of the robot is minimum.

According to the above configuration, a posture closer to the current posture of the robot is selected as the final posture. Thus, a time required for reaching the final posture is shortened.

The deciding way-point posture may include calculating a torque produced by the virtual repulsive force on a rotational shaft of each of the joints of the robot in a certain virtual posture, further calculating a change with time of the virtual posture of the robot by repeatedly performing a calculation of the virtual posture of the robot after a given period of time that changes due to an influence of the torque, by using the virtual posture as the origin, and deciding the way-point posture based on the virtual posture of the robot when the change with time of the virtual posture of the robot is converged.

According to the above configuration, the way-point posture which avoids interferences between the robot and the no-entry area is given appropriately.

The virtual repulsive force may increase in proportion to a distance of the geometric model entering into the no-entry area.

According to the above configuration, even when the geometric model of robot enters into the no-entry area deeply, it can be pushed out of the no-entry area.

The method may include determining whether the change with time of the posture of the robot does not approach the final posture, and the posture falls into a halt state, generating, when the posture is determined to fall into the halt state in the determining the halt state, a way-point posture candidate other than the posture in the state where the model is pushed out by the virtual repulsive force of the robot, firstly determining whether the way-point posture candidate is a posture that approaches the final posture, and firstly deciding, when the way-point posture candidate is determined to be the posture that changes in a direction approaching the final posture in the first determination, the way-point posture based on the way-point posture candidate.

According to this configuration, for example, when the pushing-out direction by the repulsive force matches with the direction of the initial route, since the posture pushed out into the operating area corresponds to the point on the initial route, the interference of the geometric model with the no-entry area is repeated, and the posture falls into the halt state. Therefore, the robot does not approach the final posture. However, according to the above configuration, since the way-point posture corresponding to the point which is not on the initial route can be acquired, even in such a case falling into the halt state, the robot can reach the final posture via other way-point posture closer to the final posture.

The method may include secondly determining, when the way-point posture candidate is determined to be a posture that changes in a direction of separating from the final posture in the first determination, whether the way-point posture candidate is selected based on a probability value, and secondly deciding, when the way-point posture candidate is determined to be selected in the second determination, the way-point posture based on the selected way-point posture candidate.

According to this above configuration, even if the another posture approaching final posture cannot be generated, it may be tried whether the posture is able to reach the final posture via another posture. Thus, the robot can suitably escape from the state where it cannot reach the current final posture.

In order to solve the above problems, according to one aspect of the present invention, a control device of an arm robot having a robotic arm to which a plurality of links are coupled by joints and to which a hand is provided in a tip-end part thereof is provided, which includes a geometric model expresser configured to model the robot so as to have a geometric shape and express the model as a geometric model, an area setter configured to set a no-entry area into which the geometric model is not to enter and an operating area, that is defined by the no-entry area and where the geometric model operates, a final posture decider configured to decide a final posture of the robot, an initial route decider configured to decide an initial route of the hand when the robot changes from the current posture toward the final posture, a virtual posture calculator configured to calculate a virtual posture of the robot corresponding to a given point on the initial route, an interference determinator configured to determine whether the geometric model in the virtual posture interferes with the no-entry area, a way-point posture decider configured to decide a way-point posture, and an updated route decider. The way-point posture decider decides, when the interference determinator determines that the geometric model does not interfere with the no-entry area, the virtual posture as the way-point posture, and when the interference determinator determines that the geometric model interferes with the no-entry area, the way-point posture decider virtually generates a repulsive force for relatively repelling an interfering portion of the geometric model from an interfering portion of the no-entry area, and the way-point posture decider calculates a posture in a state where the interfering portion of the geometric model is pushed out from the no-entry area into the operating area by the virtual repulsive force, and decides the calculated posture as the way-point posture. The updated route decider decides a route of the hand when the posture changes from the current posture to the final posture via the way-point posture, as an updated route. The initial route decider, the virtual posture calculator, the interference determinator, the way-point posture decider, and the updated route decider process repeatedly under an assumption of the latest way-point posture decided by the way-point posture decider being a current posture of the initial route decider.

According to the above configuration, the control device calculates the virtual posture of the robot corresponding to the given point on the initial route of the hand when the robot changes from the current posture toward the final posture, and determines whether the geometric model of the robot in the virtual posture interferes with the no-entry area (obstacles). If it is determined that the model does not interfere with the no-entry area, the virtual posture is decided as the way-point posture via which the posture changes from the current posture toward the final posture, and on the other hand, if it is determined that the model interferes with the no-entry area, the posture in the state where the interfering portion of the geometric model is pushed out from the no-entry area into the operating area by the virtual repulsive force is calculated, and is decided as the way-point posture. Therefore, since the way-point posture which does not interfere with the no-entry area is given when the geometric model of the robot interferes with the no-entry area, a collision with the obstacle is avoided. Note that, the posture deviates from the original initial route in this case, thus it cannot be secured to approach the final posture. On the other hand, since the way-point posture corresponding to the point on the initial route is given when the geometric model of the robot does not interfere with the no-entry area, the posture approaches the final posture. According to the configuration described above, since the procedure is repeated by using the newly-given way-point posture as the current posture, the way-point posture corresponding to the point on the initial route in the current procedure is given and the posture approaches the final posture each time a procedure in which the geometric model of the robot does not interfere with the no-entry area appears. Therefore, by repeating the trial and error, the updated route of the hand when the robot changes from the current posture to the final posture while avoiding the collision with the obstacle is finally acquired.

Effect of the Invention

The present invention demonstrates the effect of automatically avoiding the interference with the obstacle, and allowing the robot to reach the given posture safely with the simple setting even if the robot stops at any position.

MODES FOR CARRYING OUT THE INVENTION

Figure 1:
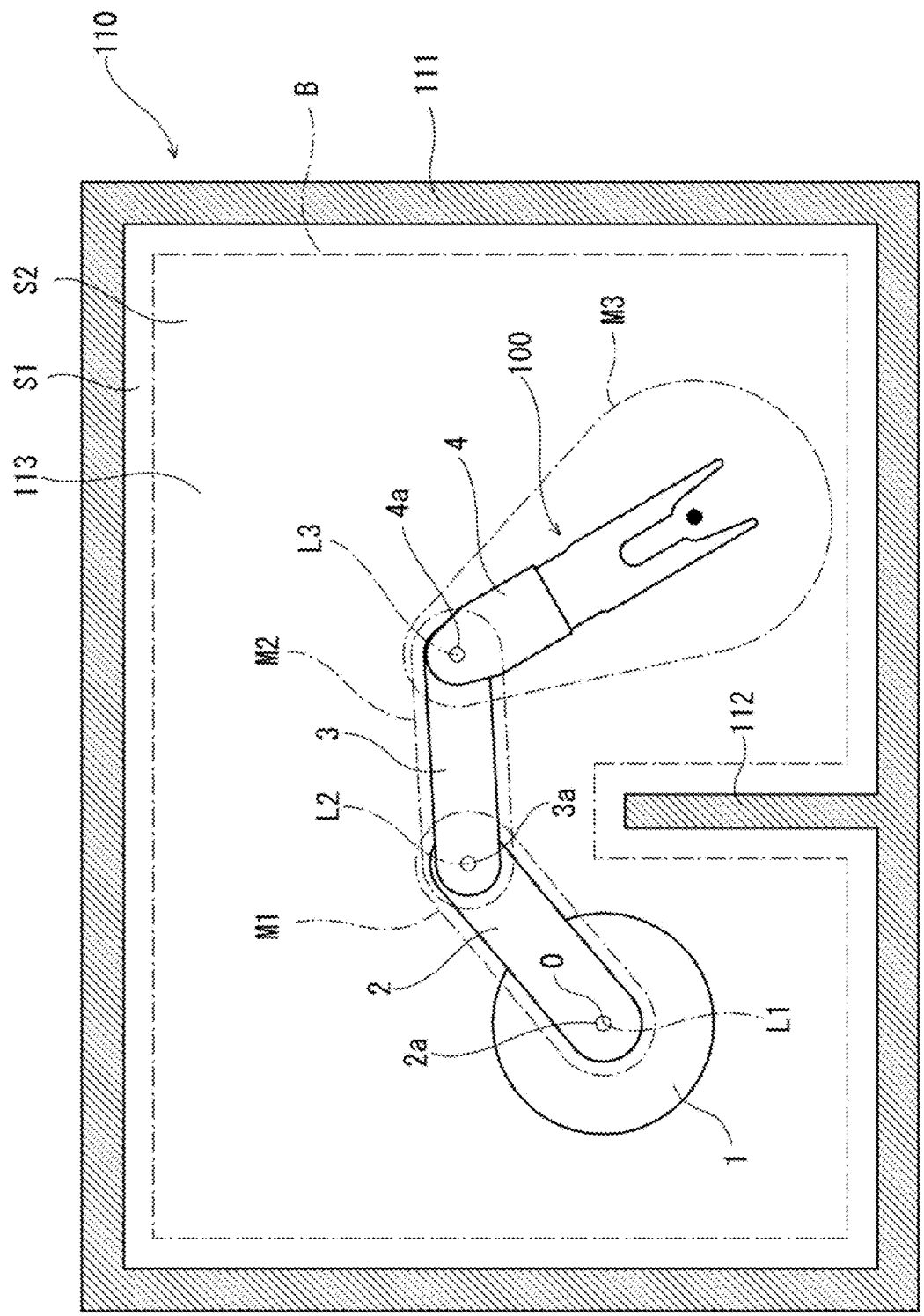
FIG. 1 is a plan view illustrating one example of a structure of a facility provided with a robot according to Embodiment 1 of the present invention.

Hereinafter, embodiments of the present invention are described with reference to the accompanying drawings. Note that the present invention is not limited by the embodiments. Moreover, below, the same reference numerals are assigned to the same or corresponding components through all the figures and, thus, redundant description is omitted.

Embodiment 1

FIG. 1 is a plan view illustrating one example of a structure of a facility 110 provided with a robot 100 according to Embodiment 1 of the present invention.
The facility 110 is, for example, a facility which processes a substrate, where the robot 100 is installed therein, and, for example, includes a wall 111 which surrounds a chamber 113, and a wall 112 which projects inside the chamber, inwardly from the wall 111. The wall 111 and the wall 112 constitute obstacles for operation of the robot 100.

[Structure of Robot]

The robot 100 is a robot which conveys a substrate, such as a semiconductor wafer or a glass wafer.
As illustrated in FIG. 1, the robot 100 is an arm robot having a robotic arm in which one or more links are coupled by joints and a hand is provided to a tip-end part. More specifically, the robot 100 is a horizontally articulated robot, and includes a pedestal 1, a first arm 2, a second arm 3, and the hand 4, which are coupled in the form of a normal chain. In this embodiment, the first arm 2, the second arm 3, and the hand 4 constitute the robotic arm. The robot 100 includes a control device 5 (see FIG. 2) which controls operation of the robot 100.
The pedestal 1 is a hollow circular cylindrical member, for example. Inside the pedestal 1, a first arm actuator 12 (see FIG. 2) including a servo motor is disposed. The first arm actuator 12 is structured to rotate a first joint shaft $2a$ described later.
The first arm 2 is a hollow plate-like member, and is formed substantially in a strip shape in the plan view, for example. The first joint shaft $2a$ is formed so as to project downwardly from a bottom surface of a base end part of the first arm 2. The first joint shaft $2a$ is attached to the pedestal 1 rotatably centering on a rotational axis L1 extending in z-direction, and this part constitutes a first joint. Thus, the first arm 2 is structured so as to rotate in xy-plane. Note that in the embodiment, the rotational axis L1 constitutes a reference point O in the xy-plane.
Inside the first arm 2, a second arm actuator 13 (see FIG. 2) including a servo motor is disposed. The second arm actuator 13 is structured so as to rotate a second joint shaft $3a$ described later.
A relative angular position q1 (see FIG. 3) of the first arm 2 on the rotational axis L1 with respect to the pedestal 1 is detected by an encoder of the servo motor of the first arm actuator 12. This encoder constitutes a first arm angular position detector 15 (see FIG. 2).

Note that the first arm 2 may be referred to as a "first link," and the first joint shaft 2a may be referred to as a "first shaft."

The second arm 3 is a hollow plate-like member, and is formed substantially in a strip shape in the plan view, for example. A second joint shaft 3a is provided so as to project downwardly from a bottom surface of a base end part of the second arm 3. The second joint shaft 3a is attached to the first arm 2 rotatably centering on a rotational axis L2 extending in parallel with the rotational axis L1, and this part constitutes a second joint. Thus, the second arm 3 is structured so as to rotate in the xy-plane.

Inside the second arm 3, a hand actuator 14 (see FIG. 2) including a servo motor is disposed. The hand actuator 14 is structured so as to rotate a third joint shaft 4a described later.

A relative angular position q2 (see FIG. 3) of the second arm 3 on the rotational axis L2 with respect to the first arm 2 is detected by an encoder of the servo motor of the second arm actuator 13. This encoder constitutes a second arm angular position detector 16 (see FIG. 2).

Note that the second arm 3 may be referred to as a "second link," and the second joint shaft 3a may be referred to as a "second shaft."

The hand 4 holds a substrate and is formed in a flat plate shape. The hand 4 has the third joint shaft 4a formed so as to project downwardly from a bottom surface of a base end part thereof. The third joint shaft 4a is attached to the second arm 3 rotatably centering on a rotational axis L3 extending in parallel with the rotational axes L1 and L2, and this part constitutes a third joint. Thus, the hand 4 is structured so as to rotate in xy-plane.

A relative angular position q3 (see FIG. 3) of the hand 4 on the rotational axis L3 with respect to the second arm 3 is detected by an encoder of the servo motor of the hand actuator 14. This encoder constitutes a hand angular position detector 17 (see FIG. 2).

Note that hand 4 may be referred to as a "third link," and the third joint shaft 4a may be referred to as a "third shaft."

[Controller]

Figure 2:
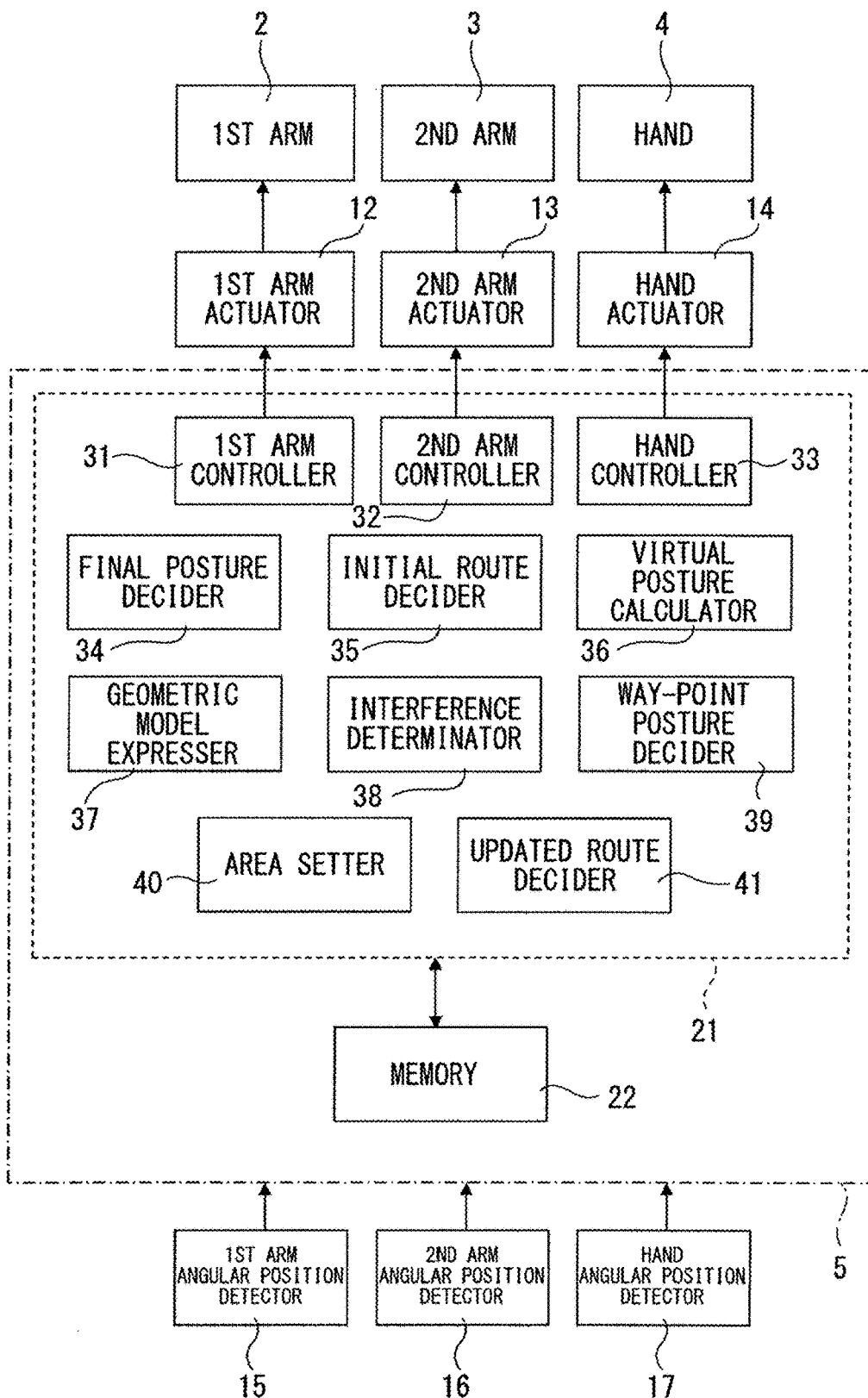
FIG. 2 is a block diagram schematically illustrating one example of a structure of a control system of the robot of FIG. 1.

FIG. 2 is a block diagram schematically illustrating one example of a structure of a control system of the robot 100.

The control device 5 provided to the robot 100 includes, for example, a controller 21 having an arithmetic unit, such as a CPU, and a memory 22 having memories, such as a ROM and a RAM. The control device 5 may be comprised of a sole controller which carries out a centralized control, or may be comprised of a plurality of controllers which carry out a distributed control in which they collaborate mutually. The controller 21 includes a first arm controller 31, a second arm controller 32, a hand controller 33, a final posture decider 34, an initial route decider 35, a virtual posture calculator 36, a geometric model expresser 37, an area setter 40, an interference determinator 38, a way-point posture decider 39, and an updated route decider 41. These functional parts 31-41 are functional blocks (functional modules) implemented by the controller 21 executing given control program(s) stored in the memory 22.

The first arm controller 31 controls the first arm actuator 12 to rotate the first arm 2 on the rotational axis L1 in the xy-plane.

The second arm controller 32 controls the second arm actuator 13 to rotate the second arm 3 on the rotational axis L2 in the xy-plane.

The hand controller 33 controls the hand actuator 14 to rotate the hand 4 on the rotational axis L3 in the xy-plane.

Note that in this embodiment, for example, a main controller (not illustrated) of the controller 21 outputs a final angular position to the first arm controller 31, the second arm controller 32, and the hand controller 33 based on the angular positions detected by the first arm angular position detector 15, the second arm angular position detector 16, and the hand angular position detector 17 of the robot 100, and a final posture, respectively. The first arm controller 31, the second arm controller 32, and the hand controller 33 carry out a feedback control of the corresponding first arm actuator 12, second arm actuator 13, and hand actuator 14 based on the angular positions of the rotational shafts detected by the corresponding angular position detectors 15, 16 and 17 so that the angular positions of the corresponding objects to be controlled (the first joint shaft 2a, the second joint shaft 3a, and the third joint shaft 4a) become the final angular positions corresponding to the final posture, respectively.

The geometric model expresser 37 models the robot 100 so as to have a geometric shape and expresses the robot 100 as a geometric model M.

In this embodiment, the geometric model expresser 37 expresses the first arm 2, the second arm 3, and the hand 4 by geometric models M1, M2, and M3, respectively.

The geometric model M1 of the first arm 2 is, for example, a model of an elongated circle as illustrated in FIG. 1. The geometric model M1 is expressed outside a geometric shape formed by projecting the first arm 2 on the xy-plane so that the model is away from the geometric shape.

The geometric model M2 of the second arm 3 is, for example, a model of an elongated circle. The geometric model M2 is expressed outside a geometric shape formed by projecting the second arm 3 on the xy-plane so that the model is away from the geometric shape.

The geometric model M3 of the hand 4 is a waterdrop-shaped model, for example. The geometric model M3 is defined (demarcated) outside a geometric shape formed by projecting the hand 4 holding the substrate on the xy-plane so that the model is away from the geometric shape.

As illustrated in FIGS. 1 and 2, the area setter 40 sets a no-entry area S1 into which the geometric models M1-M3 must not enter, and an operating area S2 which is defined (demarcated) by the no-entry area S1 and where the geometric models M1-M3 operate.

In this embodiment, the no-entry area S1 and the operating area S2 are stored in the memory 22, and the area setter 40 reads the no-entry area S1 and the operating area S2 from the memory 22 and sets the no-entry area S1 and the operating area S2.

Moreover, the no-entry area S1 is set including an area inward of the inside wall surface of the chamber 113 (the wall surfaces of the wall 111 and the wall 112) of the facility 110. A virtual line extending along the boundary between the no-entry area S1 and the operating area S2 constitutes a boundary line B.

The final posture decider 34 decides a final posture Pt of the robot 100.

In this embodiment, the final posture decider 34 selects and decides one final posture Pt from a plurality of final posture candidates Ptc stored in the memory 22.

The final posture candidate Ptc is a posture set on a known route which does not interfere (conflict) with the no-entry area S1. Thus, once the robot 100 can reach any one of the postures, it is able to operate thereafter without interfering with the no-entry area S1, while tracing the known route.

Figure 3:
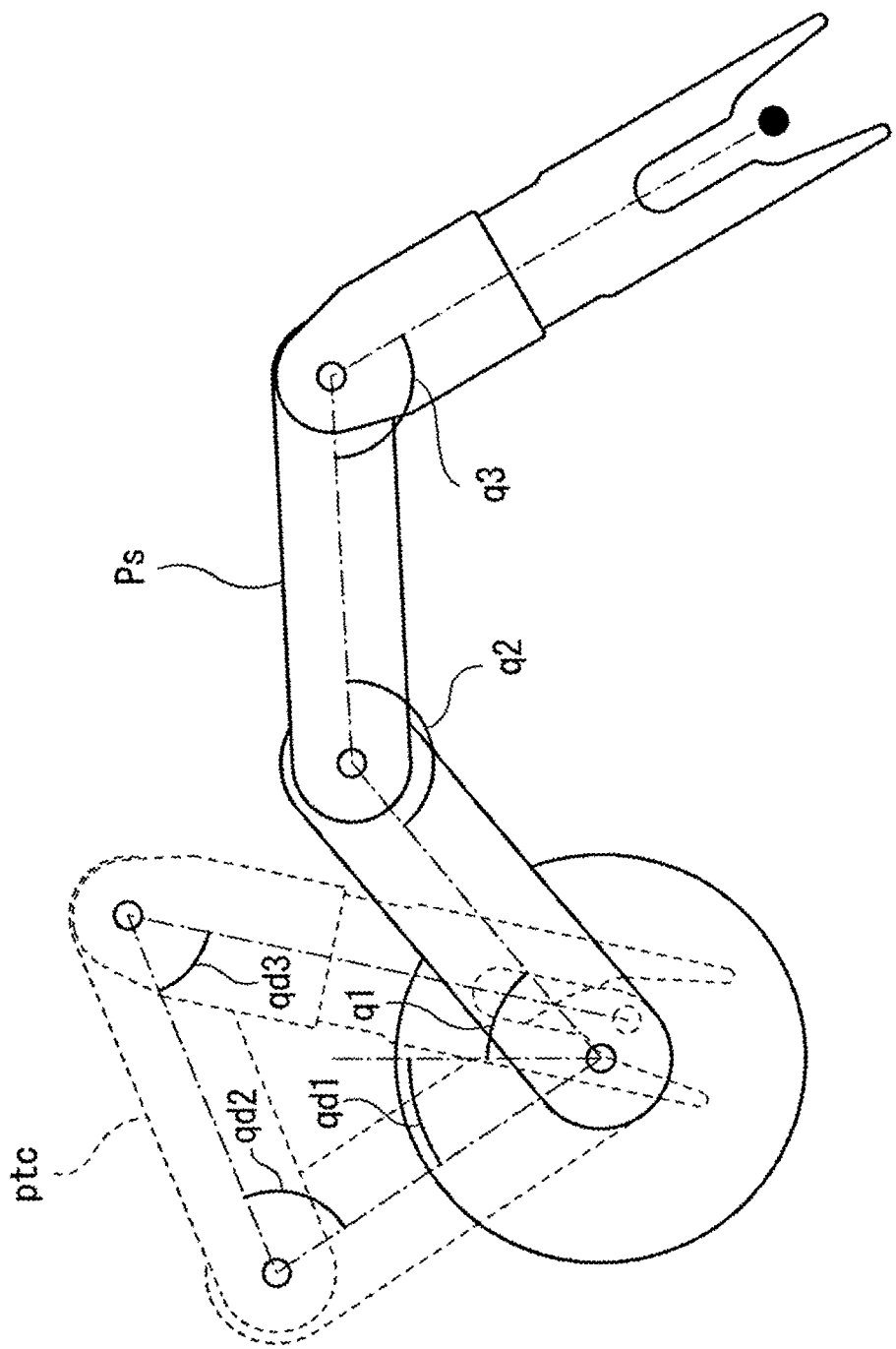
FIG. 3 is a diagram illustrating a method of selecting a final posture of the robot of FIG. 1.

FIG. 3 is a diagram illustrating a method of selecting the final posture Pt of the robot 100.

As illustrated in FIG. 3, when the final posture decider 34 selects one final posture Pt from the plurality of final posture candidates Ptc (one of them is illustrated in FIG. 3), a sum total E of absolute values of displacements in joint angles of each joint shaft between a current posture Ps and the final posture candidate Ptc is first calculated based on the following formula.

$$E = \sum_{i=1}^{n}(|q_{di} - q_i|) \quad (1)$$

Here, n is the number of shafts;

$q_i$ is a joint angle of the i-shaft in a target posture; and $q_{di}$ is a joint angle of the i-shaft in a target posture candidate.

Next, the final posture candidate Ptc with the minimum value of E is selected, and it is decided as the final posture Pt.

The initial route decider 35 decides an initial route Ta of the hand 4 when the robot 100 changes from the current posture Ps toward the final posture Pt decided by the final posture decider 34. In this embodiment, the initial route Ta is a route uniquely decided by being provided with the current posture Ps and the final posture Pt.

The virtual posture calculator 36 calculates a virtual posture Pp of the robot 100 at a given point on the initial route Ta.

The interference determinator 38 determines whether the geometric models M1-M3 of the robot 100 in the virtual posture Pp interfere with the no-entry area S1, respectively.

The way-point posture decider 39 calculates a way-point posture Pv via which the posture changes when changing from the current posture Ps toward the final posture Pt.

Furthermore, the way-point posture decider 39 decides the virtual posture Pp as the way-point posture Pv if the interference determinator 38 determines that all the geometric models M1-M3 of the robot 100 does not interfere with the no-entry area S1.

On the other hand, if the way-point posture decider 39 determines that at least one geometric model of the geometric models M1-M3 interferes with the no-entry area S1, it virtually generates a repulsive force fi for relatively repelling an interfering portion of the no-entry area S1 and an interfering portion of the geometric model. A posture in a state where the interfering portion of the geometric model is pushed out by the virtual repulsive force fi from the no-entry area S1 into the operating area S2 is calculated, and this calculated posture is decided as the way-point posture Pv.

Figure 4:
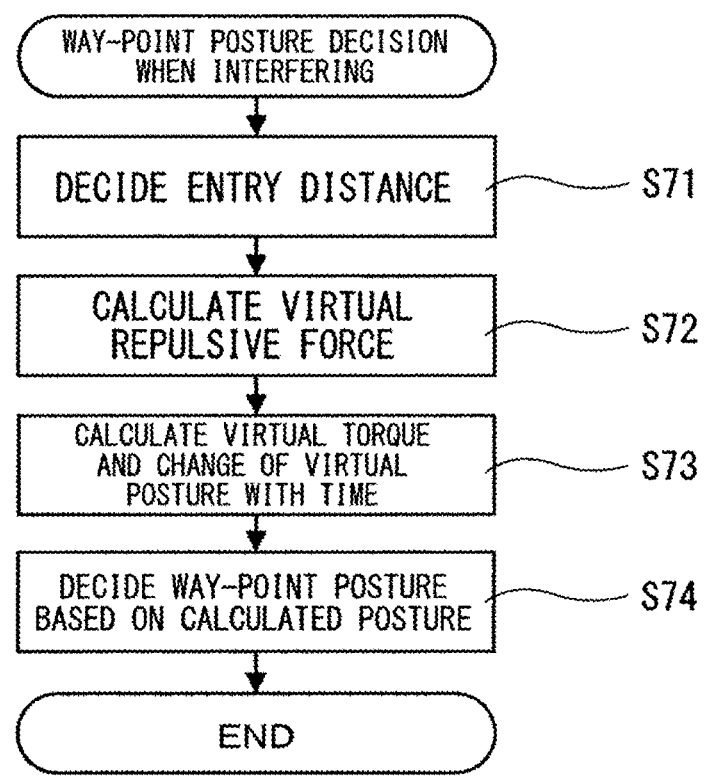
FIG. 4 is a flowchart illustrating a method of calculating a way-point posture of the robot of FIG. 1.

FIG. 4 is a flowchart illustrating a method of calculating the way-point posture Pv of the robot 100.

Figure 5A:
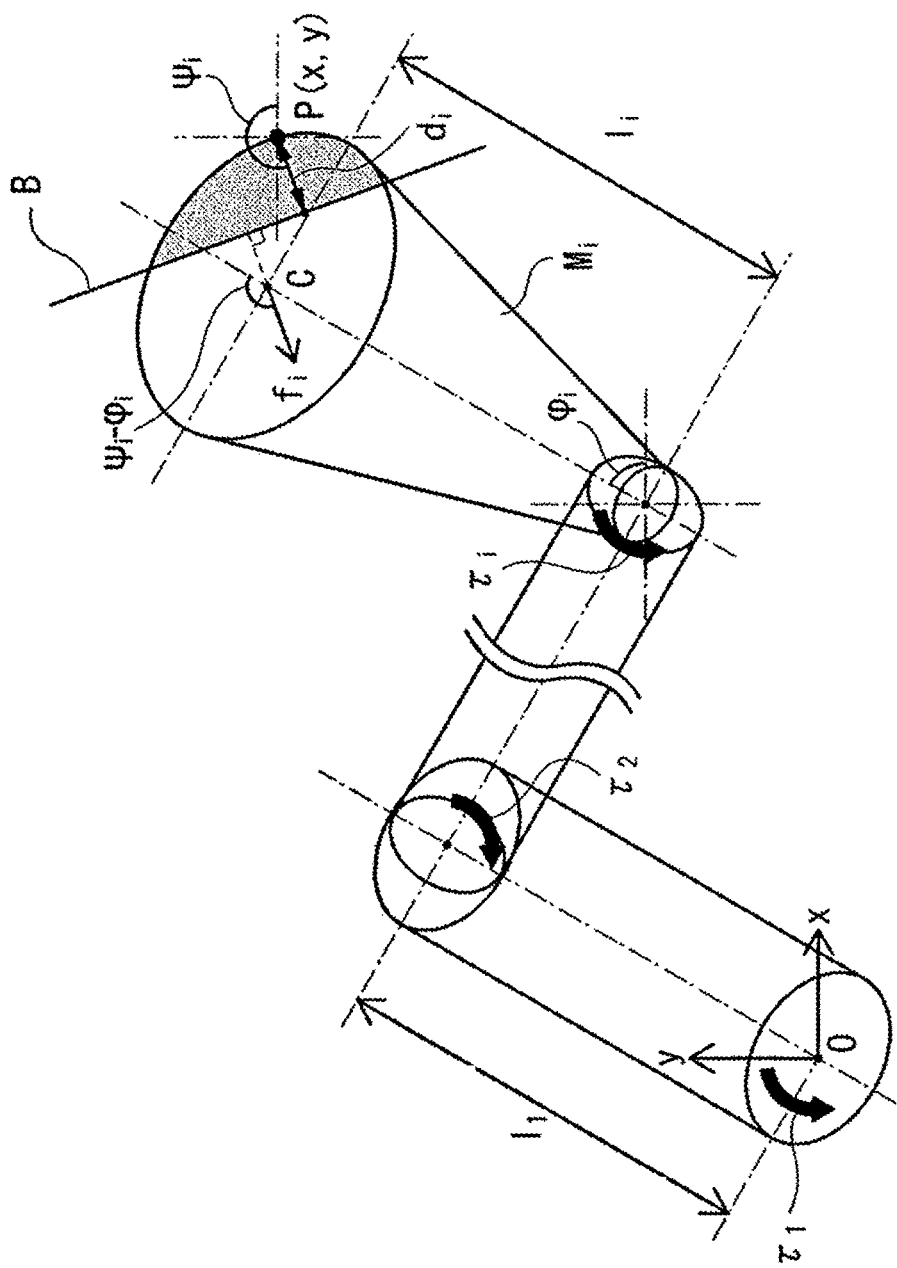
FIG. 5A is a diagram illustrating the method of calculating the way-point posture of the robot of FIG. 1.
Figure 5B:
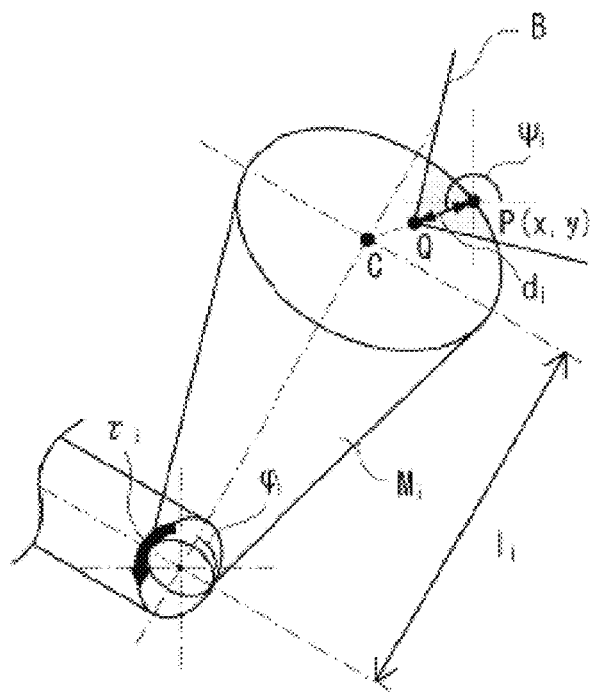
FIG. 5B is a diagram illustrating the method of calculating the way-point posture of the robot of FIG. 1.
Figure 5C:
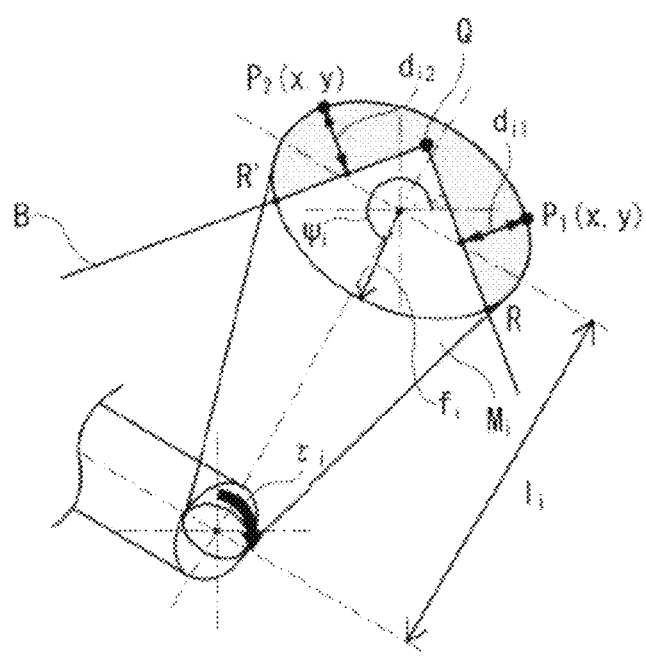
FIG. 5C is a diagram illustrating the method of calculating the way-point posture of the robot of FIG. 1.

FIGS. 5A-5C are diagrams illustrating the method of calculating the way-point posture Pv of the robot 100.

The processing performed by the way-point posture decider 39 in order to calculate the way-point posture Pv is described in detail below. Note that in the embodiment, although the robot 100 is a robot having three links, a way of thinking in which the robot is generalized as a robot having n links is described below.

First, a distance di of the geometric model of the robot 100 entering into the no-entry area S1 is decided (Step S71). The calculation of the distance di is performed according to an interference mode between each geometric model in the virtual posture Pp and the no-entry area S1.

For example, in a case as illustrated in FIG. 5A, in an interfering portion of the geometric model Mi (a gray portion in FIG. 5A), a point P (x, y) on the geometric model Mi at which a distance from the boundary line B becomes the maximum is first calculated. Then, in the normal direction of the boundary line B, the distance between the point P and the boundary line B is set as the distance di.

Moreover, in a case as illustrated in FIG. 5B, in an interfering portion of the geometric model Mi (a gray portion in FIG. 5B), a point P(x, y) on the geometric model Mi at which a distance from the boundary line B becomes the maximum is first calculated. Then, the distance between the point P and a peak Q of the boundary line B is set as the distance di.

Furthermore, in a case as illustrated in FIG. 5C, first, in an interfering portion of the geometric model Mi (a gray portion in FIG. 5C), a point P1 (x, y) on the geometric model Mi which is located on the side from the peak Q of the boundary line B toward one of intersections R between the geometric model and the boundary line B and at which a distance with the boundary line B becomes the maximum is calculated. Then, in the normal direction of a line segment QR, the distance between the point P1 and the boundary line B is set as a distance di1.

Moreover, in the interfering portion of the geometric model Mi, a point P2(x, y) on the geometric model which is located on the side from the peak Q of the boundary line B toward the other intersection R' of the geometric model and the boundary line B and at which the distance with the boundary line B becomes the maximum is calculated. Then, in the normal direction of a line segment QR', the distance between the point P2 and the boundary line B is set as a distance di2.

Thus, the calculation of the distance di is, but not limited to be, configured to be performed according to the interference mode between the geometric model in the virtual posture Pp and the no-entry area S1.

Next, based on the decided distance di, the virtual repulsive force fi is calculated for each link based on the following Formula (2) (Step S72).

$$\begin{cases} f_i = kd_i & \text{(conflict)} \\ f_i = 0 & \text{(no conflict)} \end{cases} \quad (2)$$

Here, i is a link number;

k is an arbitrary virtual stiffness coefficient; and $d_i$ is an entry distance from the no-entry boundary line B.

Note that, in a case as illustrated in FIG. 5C, after calculating the virtual repulsive forces fi1 and fi2 by using Formula (2) based on the decided distances di1 and di2, respectively, the virtual repulsive forces fi1 and fi2 are synthesized to calculate the virtual repulsive force fi.

That is, the virtual repulsive force fi proportional to the distance of the geometric model entering into the no-entry area S2 for the i-th link determined to be interfering with the no-entry area S1 is virtually generated. Thus, when the geometric model enters deeply into the no-entry area S1, the model will be pushed out strongly. Therefore, the time taken to push out the geometric model is shortened.

Meanwhile, the virtual repulsive force fi is configured not to be generated for the i-th link which is determined not to be interfering with the no-entry area S1.

Next, a virtual torque T produced on each axis of the robot 100 by the virtual repulsive force fi is calculated (Step S73).

$$\tau = \begin{bmatrix} \tau_1 \\ \tau_2 \\ \vdots \\ \tau_n \end{bmatrix} = \quad (3)$$

-continued $$\begin{bmatrix} w_n l_1 \sin(\psi_1 - \varphi_1) & w_n l_1 \sin(\psi_2 - \varphi_1) & \ldots & w_1 l_1 \sin(\psi_n - \varphi_1) \\ 0 & w_n l_2 \sin(\psi_2 - \varphi_2) & \ldots & w_2 l_2 \sin(\psi_n - \varphi_2) \\ \vdots & \vdots & \vdots & \vdots \\ 0 & 0 & \ldots & w_n l_n \sin(\psi_n - \varphi_n) \end{bmatrix} \begin{bmatrix} f_1 \\ f_2 \\ \vdots \\ f_n \end{bmatrix}$$

Here, $\tau_i$ is a torque produced on i-th shaft;

$l_i$ is a length of i-th link (1<i<n);

$w_n$ is a weight coefficient which is set so that the influence of the i<n-th virtual repulsive forces $f_i$ is smaller as it is separated from the i-th link, e.g., $$w_n = 1, w_{n-1} = \frac{1}{2}, \ldots w_1 = \left(\frac{1}{2}\right)^{n-1};$$

$\psi_i$ is an angle between the normal direction of the no-entry boundary line B and the x-axis in the xy-plane; and $\varphi_i$ is an angle between the i-th (1≤i≤n) link and the x-axis in the xy-plane.

That is, the virtual repulsive force fi generated in the i-th link determined to be interfering with the boundary line B is configured to influence not only on the i-th link but also on the i<n-th link. Thus, even if the point at which the virtual repulsive force fi is generated in the i-th link is a dead center of the link concerned, the virtual repulsive force fi concerned affects other links and generates the torque. Therefore, other links rotate by the torque and a way-point posture Pv different from the virtual posture Pp is generated.

Moreover, the calculation of the angle ψi is performed according to the interference mode between each geometric model and the no-entry area S1.

For example, in the case as illustrated in FIG. 5A, the angle ψi is an angle between the normal direction of the boundary line B and the x-axis in the xy-plane.

Moreover, in the case as illustrated in FIG. 5B, the angle ψi is an angle between the line segment PQ and the x-axis.

Furthermore, in the case as illustrated in FIG. 5C, the angle ψi is an angle between the synthesized vector of the virtual repulsive forces described above and the x-axis.

Next, a change of the virtual posture of the robot 100 with time, which is caused under the influence of the virtual torque τi described above is calculated.

$$q[k+1] = q[k] + \alpha \dot{q}[k] + \beta \tau[k] \quad (4)$$

Here, q[0] is a current posture;

$\dot{q}[0]=0$;

τ[0] is calculated from Formula (3); and

α, β are constants set such that the robot behaves as desired.

Here, $\dot{q}$ is a character in which a dot is attached on top of q.

Formula (2) and Formula (3) are repeatedly calculated to calculate q[k] when τ[k] and $\dot{q}$[k] are converged to 0. This q[k] is a posture when the first arm 2, the second arm 3, and the hand 4 are pushed out from the no-entry area S1 into the operating area S2.

Then, the virtual posture Pp is set based on q[k] (Step S74).

The updated route decider 41 decides as an updated route Tb a route of the hand 4 when the posture changes from the current posture Ps to the final posture Pt via the way-point posture Pv.

[Example of Operation]

Next, one example of operation of the robot 100 is described.

Figure 6:
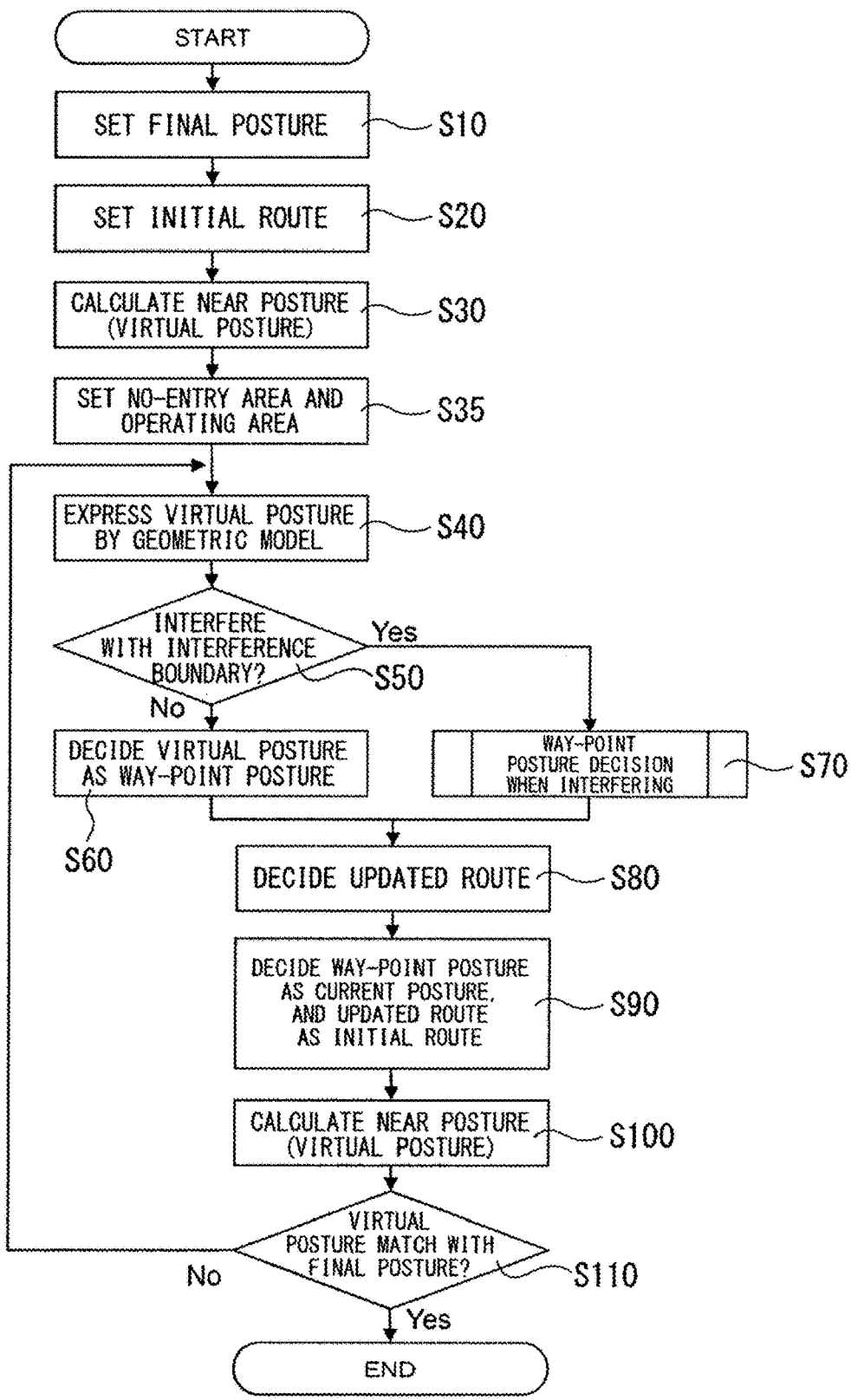
FIG. 6 is a flowchart illustrating one example of operation of the robot of FIG. 1.

FIG. 6 is a flowchart illustrating one example of operation of the robot 100 in this embodiment of the present invention. FIGS. 7A to 7F are views illustrating one example of operation of the robot 100 in this embodiment of the present invention.

Figure 7A:
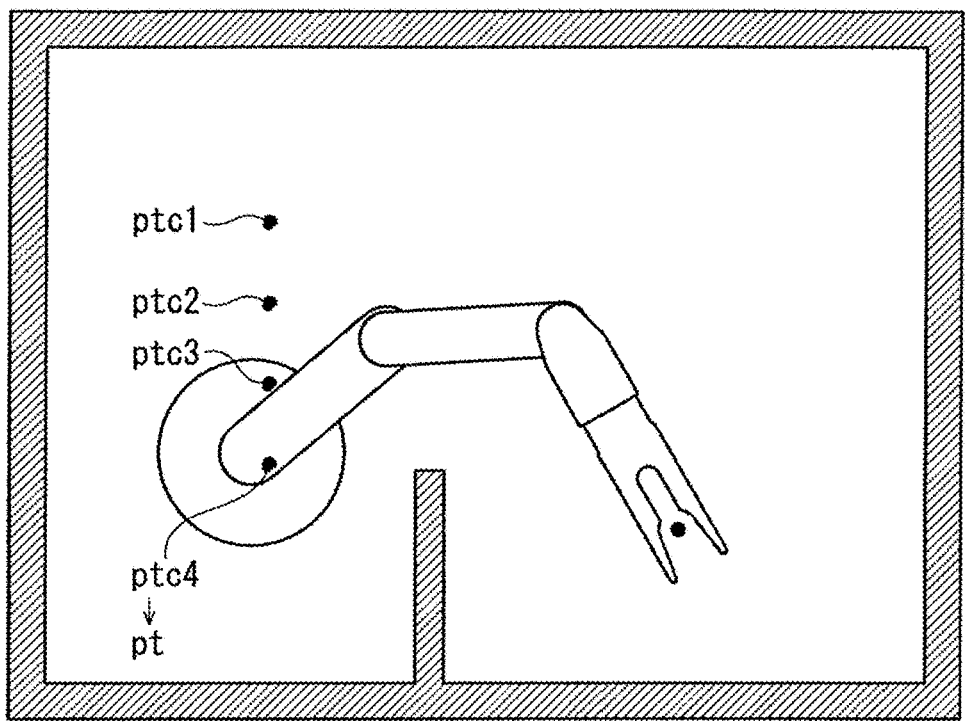
FIG. 7A is a view illustrating the example of operation of the robot of FIG. 1.

First, as illustrated in FIG. 7A, the final posture decider 34 of the controller 21 decides the final posture Pt of the robot 100 (a final posture deciding step) (Step S10). In this embodiment, the final posture decider 34 of the controller 21 calculates the values of E for the four final posture candidates Ptc1-Ptc4, and selects the final posture candidate Ptc4 with the minimum value of E as the final posture Pt. Thus, since the posture close to the current posture Ps is configured to be selected as the final posture Pt, a displacement of each axis required for reaching the final posture Pt from the current posture Ps is reduced, and an average time required for the reaching is shortened.

Figure 7B:
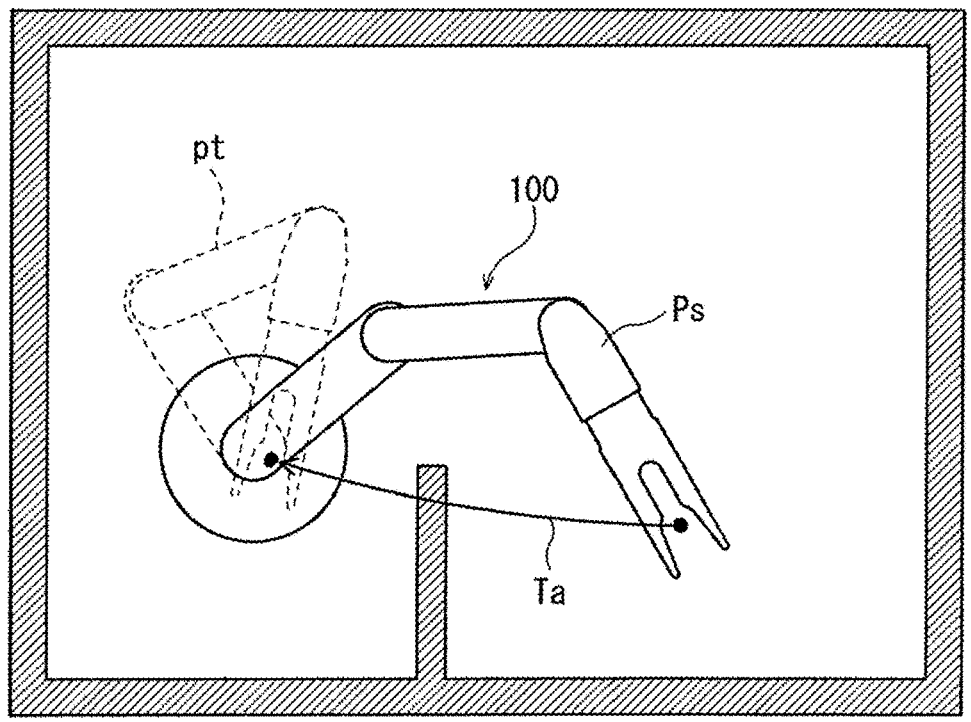
FIG. 7B is a view illustrating the example of operation of the robot of FIG. 1.

Next, as illustrated in FIG. 7B, the initial route decider 35 of the controller 21 decides the initial route Ta on which the robot 100 changes from the current posture Ps toward the final posture Pt (an initial route deciding step) (Step S20).

Figure 7C:
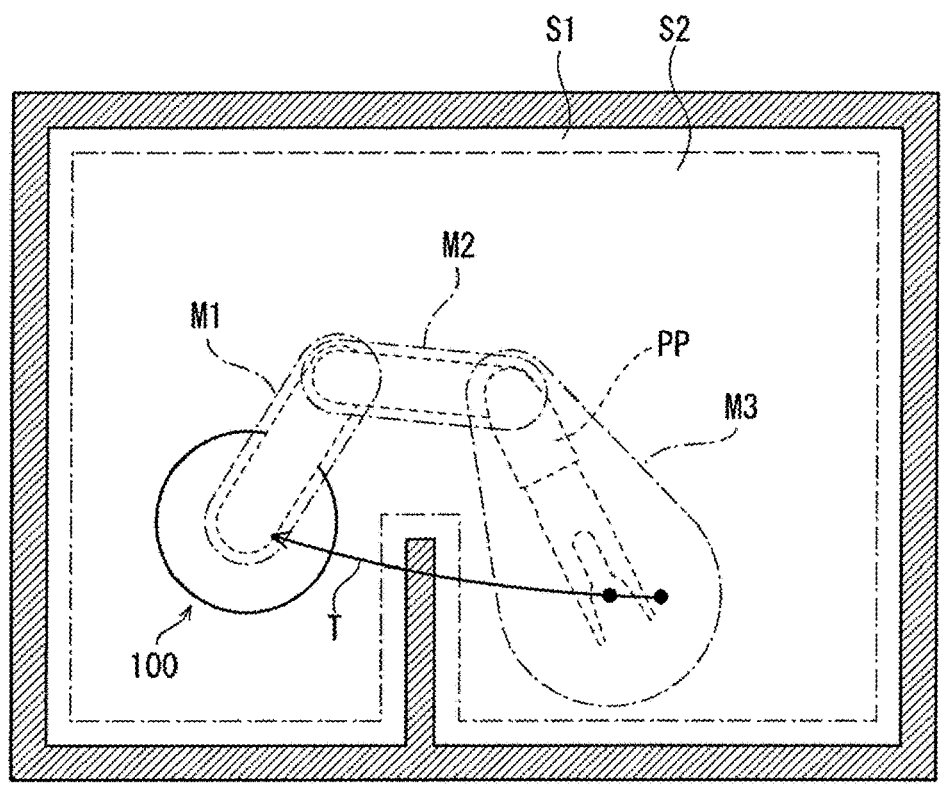
FIG. 7C is a view illustrating the example of operation of the robot of FIG. 1.

Next, as illustrated in FIG. 7C, the virtual posture calculator 36 of the controller 21 calculates the virtual posture Pp of the robot 100 at a given point which is near the current posture Ps on the initial route Ta and on the side toward the final posture Pt from the current posture Ps (a virtual posture calculation step) (Step S30). The term "near" as used herein refers to a posture which is obtained by adding a minute change to each axis from the current posture.

Next, the area setter 40 of the controller 21 reads from the memory 22 and sets the no-entry area S1 and the operating area S2 (an area setting step) (Step S35).

Next, the geometric model expresser 37 of the controller 21 models the first arm 2, the second arm 3, and the hand 4 of the robot 100 in the virtual posture Pp, and expresses them by the geometric models M1, M2, and M3, respectively (a geometric model expression step) (Step S40).

Since the geometric models M1-M3 are models which express the first arm 2, the second arm 3, and the hand 4 of the robot 100 in a simplified manner, the calculation amount required for a determination of interference described later is reduced and, thus, the determination of interference is performed quickly.

Moreover, the perimeters of the geometric shapes drawn by the virtual lines of the geometric models M1 to M3 are defined (demarcated) outside the geometric shape formed by projecting the hand 4 holding the substrate on the xy-plane so that the model is away from the geometric shape, as above-described. That is, since the geometric models are expressed thicker than the first arm 2, the second arm 3, and the hand 4, even the interference determinator 38 of the controller 21 determines at Step S50 described later that the geometric model interferes with the no-entry area S1, the robot 100 is prevented from interfering with the facility 110 and, thus, the robot 100 or the substrate held by the robot 100 is prevented from actually contacting the facility 110.

In addition, since the no-entry area S1 is set including the area inside the inside wall surface of the chamber 113 of the facility 110, the robot 100 or the substrate held by the robot 100 is more certainly prevented from actually contacting the facility 110.

Next, the interference determinator 38 of the controller 21 determines whether the geometric models M1-M3 in the virtual posture Pp interfere with the no-entry area S1, respectively (an interference determining step) (Step S50). That is, the phrase "the geometric model interferes with the no-entry area S1" as used herein refers to a state where the boundary line of the geometric model intersects the boundary line B.

Note that in the embodiment, the geometric model expresser 37 generates the geometric models at the step immediately before the interference determination performed by the interference determinator 38. However, without limiting to the configuration, the generation may be performed at any steps before the interference determination performed by the interference determinator 38.

Similarly, the settings of the no-entry area S1 and the operating area S2 performed by the area setter 40 may be performed at any steps before the interference determination performed by the interference determinator 38.

Then, if it is determined that nothing interferes (No at Step S50), the way-point posture decider 39 of the controller 21 decides the virtual posture Pp as the way-point posture Pv (a way-point posture deciding step) (Step S60).

Therefore, since the way-point posture corresponding to the point on the initial route Ta is given if the geometric model of the robot 100 does not interfere with the no-entry area S1, the posture approaches the final posture Pt.

Figure 7D:
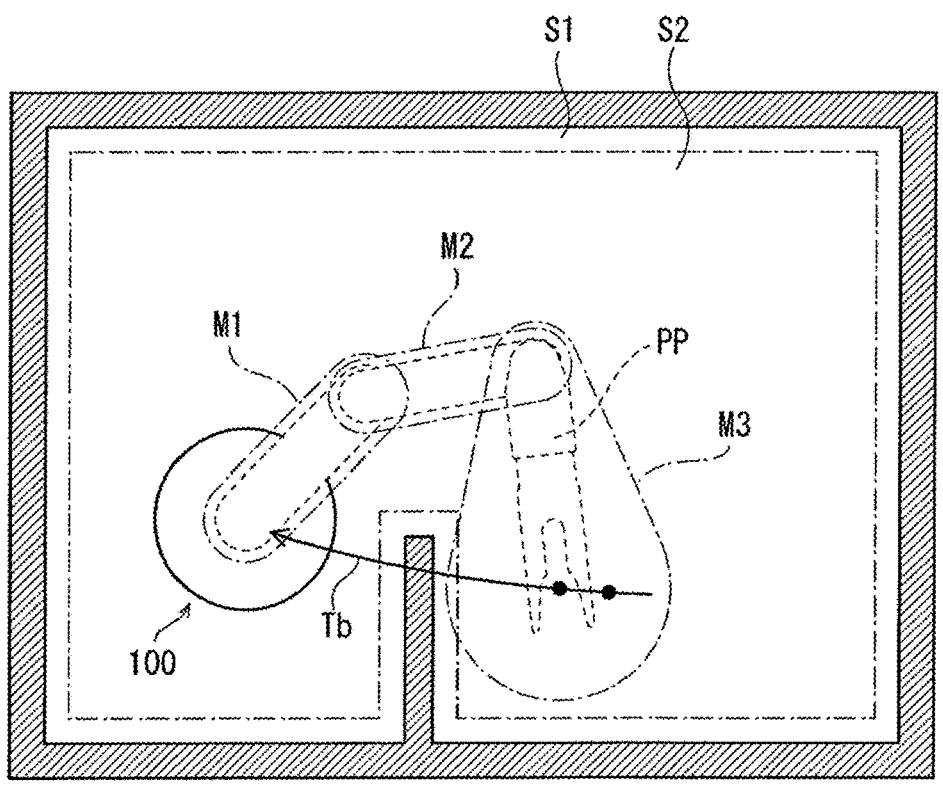
FIG. 7D is a view illustrating the example of operation of the robot of FIG. 1.
Figure 7E:
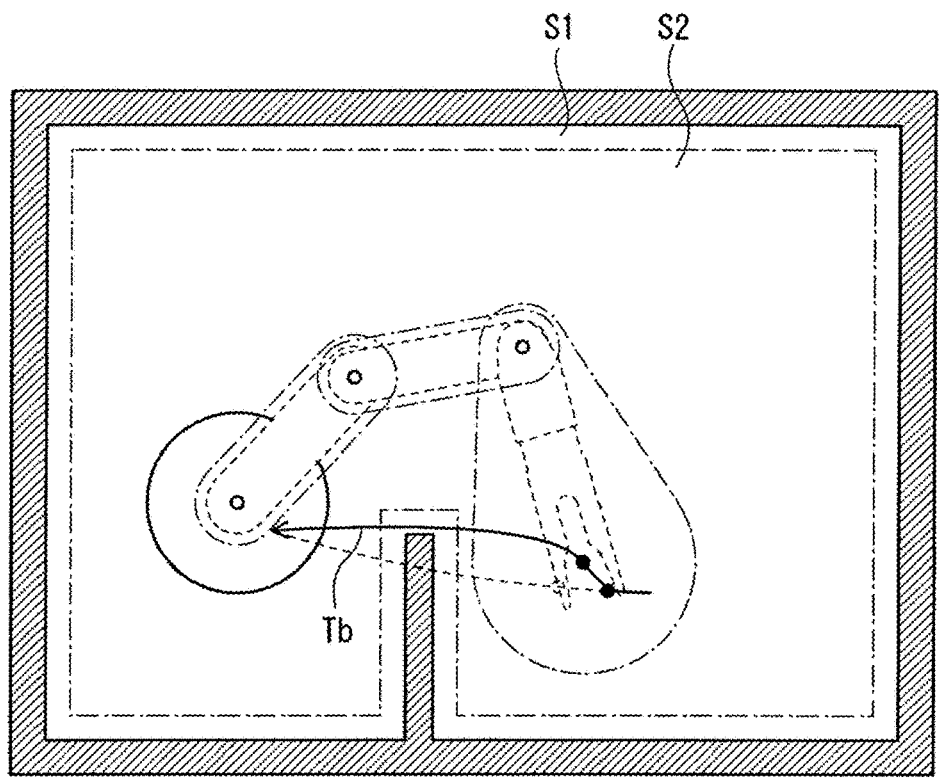
FIG. 7E is a view illustrating the example of operation of the robot of FIG. 1.

On the other hand, as illustrated in FIG. 7D, if the interference determinator 38 of the controller 21 determines at Step S50 that the geometric model interferes with the boundary line B (Yes at Step S50), the way-point posture decider 39 of the controller 21 calculates the posture in the state where the interfering portion of the geometric model is pushed out from the no-entry area S1 into the operating area S2, and decides the calculated posture as the way-point posture Pv, as illustrated in FIG. 7E (a way-point posture deciding step) (Step S70).

Therefore, if the geometric model of the robot 100 interferes with the no-entry area S1, since the way-point posture Pv which does not interfere with the no-entry area S1 is given, a collision with an obstacle is avoided.

Note that, when deciding the virtual posture described above as the way-point posture Pv, it may further be determined whether the route on the way to reach the posture in the pushed-out state from the current posture interferes with the no-entry area S1.

When the way-point posture Pv is decided at Step S60 or Step S70, the updated route decider 41 of the controller 21 then decides the route of the hand 4 when the posture changes from the current posture Ps to the final posture Pt via the way-point posture Pv as the updated route Tb (an updated route deciding step) (Step S80).

Next, the controller 21 decides (assumes) the way-point posture Pv as a new current posture Ps, and also decides (assumes) the updated route Tb as a new initial route Ta (Step S90).

Next, the virtual posture calculator 36 of the controller 21 calculates a new virtual posture Pp at a given point on the side toward the final posture Pt from the current posture Ps, which is near the current posture Ps on the initial route Ta (Step S100).

Next, it is determined whether the virtual posture Pp calculated at Step S100 matches with the final posture Pt. If it is determined that the virtual posture Pp does not match with the final posture Pt (No at Step S110), Steps S40-S110 described above are repeatedly executed. That is, Steps S40-S110 are executed until the current posture Ps matches with the final posture Pt.

Figure 7F:
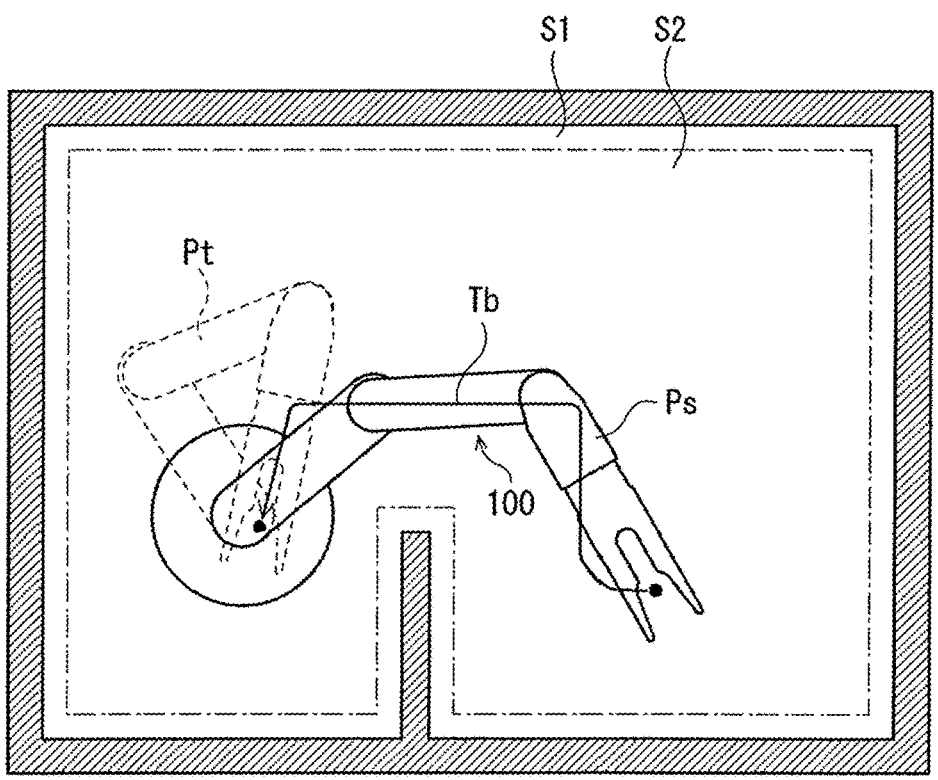
FIG. 7F is a view illustrating the example of operation of the robot of FIG. 1.

If the virtual posture Pp calculated at Step S100 matches with the final posture Pt (Yes at Step S110), the processing is ended. Thus, as illustrated in FIG. 7F, the final updated route Tb which avoids interferences with the no-entry area S1 is generated.

Note that in the embodiment, after the processing described above is completed, the robot 100 is configured so that the robot 100 is actually moved from the current posture Ps toward the final posture Pt along the final updated route Tb. That is, when the way-point posture Pv is reset as the new current posture Ps at Step S90, the controller 21 is configured to store the history of the decided updated route Tb in the memory 22, without moving the first arm 2, the second arm 3, and the hand 4 toward the current posture Ps. However, without limiting to this configuration, the controller 21 may actually move the first arm 2, the second arm 3, and the hand 4 toward the current posture Ps each time it decides the way-point posture Pv as the new current posture Ps at Step S90.

As described above, the robot 100 of the present invention calculates the virtual posture Pp of the robot 100 corresponding to the given point on the initial route Ta of the hand 4 when the robot 100 changes from the current posture Ps toward the final posture Pt, and determines whether the geometric models M1-M3 of the robot 100 in the virtual posture Pp interfere with the no-entry area S1 defined (demarcated) corresponding to obstacles. If it is determined that the models do not interfere with the no-entry area S1, the virtual posture Pp is determined as the way-point posture Pv via which the posture changes from the current posture Ps toward the final posture Pt, and on the other hand, if it is determined that the models interfere with the no-entry area S1, the posture in the state where the interfering portion of the geometric model is pushed out from the no-entry area S1 into the operating area S2 by the virtual repulsive force fi is calculated, and is decided as the way-point posture Pv. Therefore, since the way-point posture Pv which does not interfere with the no-entry area S1 is given when the geometric model of the robot 100 interferes with the no-entry area S1, a collision with an obstacle is avoided.

On the other hand, since the way-point posture Pv corresponding to the point on the initial route Ta is given when the geometric model of the robot 100 does not interfere with the no-entry area S1, the posture approaches the final posture Pt. According to the configuration described above, since the procedure is repeated by using the newly-given way-point posture Pv as the current posture Ps, the way-point posture Pv corresponding to the point on the initial route Ta in the current procedure is given and the posture approaches the final posture Pt each time a procedure in which the geometric model of the robot 100 does not interfere with the no-entry area S1 appears. Therefore, by repeating the trial and error, the updated route Tb of the hand 4 when the robot 100 changes from the current posture Ps to the final posture Pt while avoiding the collision with the obstacle is finally acquired.

As a result, the simple settings of the geometric models, the no-entry area, and the operating area of the robot enable the automatic avoidance of the interferences with obstacles even if the robot stops at any position, and allow the robot to safely reach the given posture.

Embodiment 2

Below, the structure or configuration and operation of Embodiment 2 are described focusing on differences from Embodiment 1.

In Embodiment 1 described above, the initial route Ta is a route uniquely decided by being provided with the current posture Ps and the final posture Pt. Moreover, the way-point posture Pv decided at Step S70 is the posture uniquely decided with the spatial relationship between each geometric model and the boundary line B in the virtual posture Pp. Thus, in Embodiment 1, for example, when the pushing-back direction of the repulsive force matches with the direction of the initial route Ta, the updated route Tb decided based on the posture in the state where the model is pushed out by the virtual repulsive force fi may not approach the final posture Pt.

This embodiment is an embodiment in consideration of the case where the updated route Tb does not approach the final posture Pt.

Figure 8:
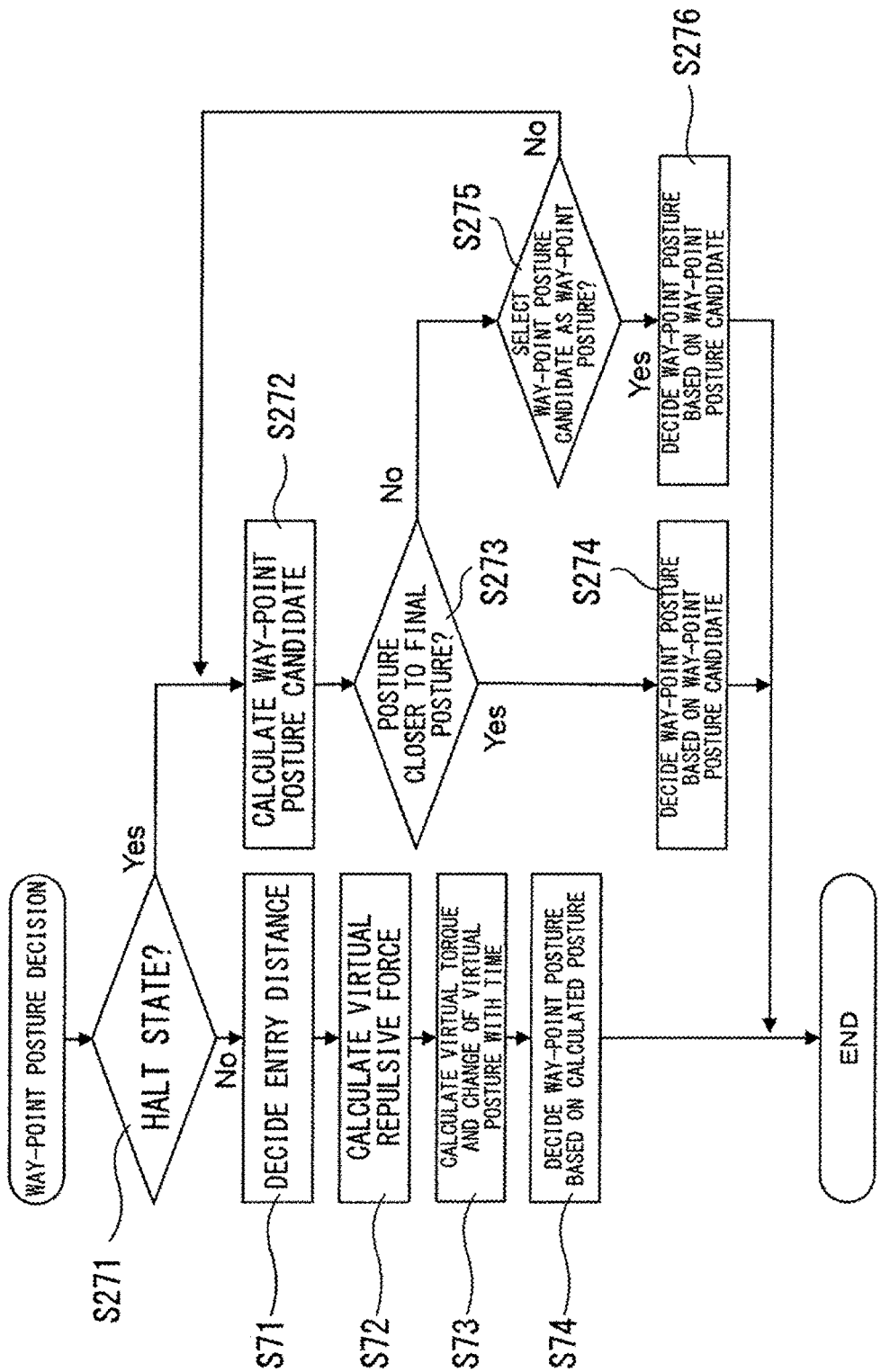
FIG. 8 is a flowchart illustrating one example of operation of a robot according to Embodiment 2 of the present invention.

FIG. 8 is a flowchart illustrating one example of operation of the robot 100 according to Embodiment 2 of the present invention.

In this embodiment, the deciding of the way-point posture at Step S70 is executed as follows.

First, it is determined whether the posture falls into a halt state (a halt state determining step) (Step S271). In this embodiment, the determination of whether the posture falls into the halt state is to calculate the sum total E of the absolute values of the displacements in the joint angle of each joint shaft between the virtual posture Pp and the final posture Pt based on the following Formula (5).

$$E(q_r)=\Sigma_{i=1}^{n}(|q_{gi}-q_{ri}|) \quad (5)$$

Here,
n is the number of shafts;
$q_{ri}$ is a joint angle of i-th shaft in the virtual posture Pp; and
$q_{gi}$ is a joint angle of i-th shaft in the target posture Pt.

If the value of E decreases, it is determined that the posture is closer to the final posture. On the other hand, if the value of E does not changes or increases, it is determined that the posture is not approaching the final posture Pt or going away from the final posture Pt, respectively. In addition, at a given time interval, if the state where the value of E does not change or increases continues, it is determined that the posture falls into the halt state.

Then, at Step S271, if the controller 21 determines that the posture does not fall into the halt state, it performs Steps S71-S74. Since Steps S71-S74 are similar to Steps S71-S74 of Embodiment 1 described above, the description thereof is omitted.

On the other hand, if the controller 21 determines that the posture falls into the halt state at Step S271, the way-point posture decider 39 of the controller 21 calculates a way-point posture candidate Pvc other than the posture in the state where the model is pushed out by the virtual repulsive force fi near the current posture Ps (a way-point posture candidate generation step) (Step S272). In this embodiment, the way-point posture candidate Pvc is, but not limited to, a posture generated at random. Alternatively, the way-point posture candidate Pvc may be generated according to a situation around the current posture Ps, for example.

Next, it is determined whether the way-point posture candidate Pvc is a posture closer to the final posture Pt than the current posture Ps (a first determination step) (Step S273). In this embodiment, the determination whether the way-point posture candidate Pvc is closer to the final posture Pt is made by comparing the value of E calculated based on the following Formula (6) with the value of E calculated based on the following Formula (7).

$$E(q_r)=\Sigma_{i=1}^{n}(|q_{gi}-q_{ri}|) \quad (6)$$

$$E(q)=\Sigma_{i=1}^{n}(|q_{gi}-q_{i}|) \quad (7)$$

$$\Delta=E(q_r)-E(q) \quad (8)$$

Here,
n is the number of shafts;
$q_{gi}$ is a joint angle of i-th shaft in the target posture Pt;
$q_{ri}$ is a joint angle of i-th shaft in the way-point posture candidate Pvc; and
$q_i$ is a joint angle of i-th shaft in the current posture Ps.

That is, Formula (6) described above is to calculate a sum total $E(qr)$ of the absolute values of the displacements in the joint angle of each joint shaft between the way-point posture candidate Pvc and the final posture Pt. Moreover, Formula (7) described above is to calculate a sum total E(q) of the absolute values in the displacement of the joint angle of each joint shaft between the current posture Ps and the final posture Pt. Formula (8) described above is a formula to compare the value of E(qr) with the value of E(q).

For example, in Formula (8) described above, if $\Delta \leq 0$, i.e., if the value of E(qr) according to the way-point posture candidate Pvc is equal to or smaller than the value of E(q) of the current posture Ps, it is determined that the posture is closer to the final posture Pt. On the other hand, if $\Delta > 0$, i.e., if the value of E(qr) according to the way-point posture candidate Pvc is larger than the value of E(q) of the current posture Ps, it is determined that the posture is not closer to the final posture Pt.

If the way-point posture decider 39 of the controller 21 decides that the posture is closer to the final posture Pt (Yes at Step S273), it decides the way-point posture Pv based on the way-point posture candidate Pvc (a first deciding step) (Step S274). Furthermore, it is determined whether the route from the current posture to the way-point posture Pv concerned interferes with the no-entry area S1.

On the other hand, if the way-point posture decider 39 of the controller 21 determines that the posture is not closer to the final posture Pt (No at Step S273), it determines whether the way-point posture candidate Pvc is further selected as the way-point posture Pv (a second determination step) (Step S275).

Figure 9:
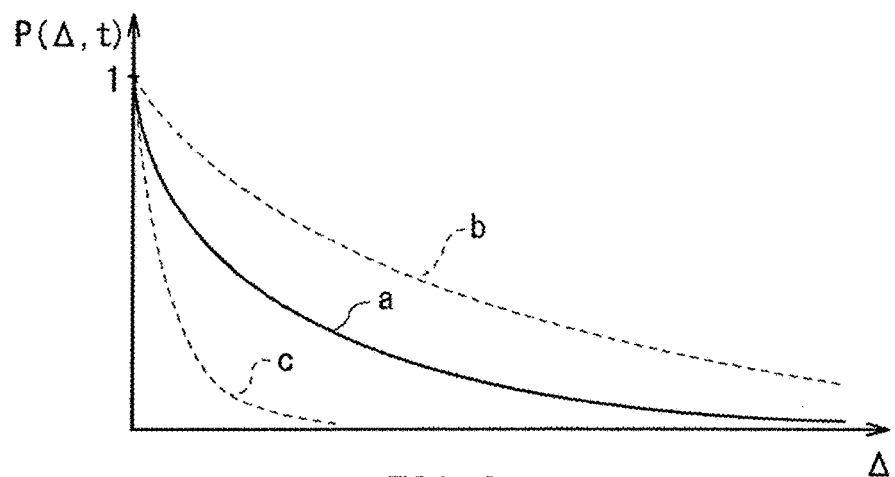
FIG. 9 is a graph illustrating a transition probability used in processing of the robot of FIG. 8.

This selection is performed using a probability value. In this embodiment, in the selection, a transition probability $P(\Delta, t)$ according to the an evaluation value of the way-point posture candidate Pvc is calculated by the following Formula (9), and decides whether the way-point posture candidate Pvc is selected as the way-point posture Pv according to the probability. A graph of the transition probability is illustrated by a line indicated with "a" in a FIG. 9.

$$P(\Delta, t)=e^{-\Delta/t} \quad (9)$$

Here,
t is a parameter; and
$\Delta$ is calculated by Formula (8).

Thus, as for the transition probability $P(\Delta, t)$, as $\Delta$ approaches 0, i.e., as the way-point posture candidate Pvc less deviates or less separates from the final posture Pt than the current posture Ps, a possibility that the way-point posture candidate Pvc is selected as the way-point posture Pv increases (the possibility approaches 1), and on the other hand, as the way-point posture candidate Pvc more deviates from the final posture Pt than the current posture Ps, the possibility that the way-point posture candidate Pvc is selected as the way-point posture Pv decreased (the probability approaches 0).

If the way-point posture candidate Pvc is selected as the way-point posture Pv, the way-point posture Pv is decided based on the way-point posture candidate Pvc (the second deciding step) (Step S276).

Then, the controller 21 executes the processings at and after Step S80 similar to the embodiment described above.

Note that, if the deviation of the way-point posture candidate Pvc from the final posture Pt with respect to the current posture Ps is small, it may be difficult to find a posture escapable from the halt state. In such a case, as illustrated by a line "b" in the graph of FIG. 9, the value of the parameter "t" of Formula (9) described above may be adjusted to be increased when the posture falls into the halt state so that, even if the deviation of the way-point posture candidate Pvc from the final posture Pt is comparatively larger than the current posture Ps, the way-point posture candidate Pvc is easy to be selected.

Moreover, it is desirable to lower the probability to select a posture which deviates from the final posture Pt as the current posture Ps approaches the final posture Pt. Thus, as the current posture Ps approaches the final posture Pt, the probability to select the posture which deviates from the final posture Pt may be lowered by decreasing the value of Parameter "t," as illustrated by the line "b" in the graph of FIG. 9.

Thus, in the embodiment, for example, when the pushing-out direction by the repulsive force fi matches with the direction of the initial route Ta, since the posture pushed out into the operating area S2 corresponds to the point on the initial route Ta, the interference of the geometric model with the no-entry area S1 is repeated, and the posture falls into the halt state. Therefore, the robot 100 does not approach the final posture Pt (it cannot reach the final posture). In such a case, the way-point posture Pv corresponding to the point which is not on the initial route Ta can be acquired, the updated route Tb can be decided based on this posture, and the robot can reach the final posture Pt via other way-point postures Pv closer to the final posture Pt.

Moreover, even if the another posture approaching final posture Pt cannot be calculated, it may be tried whether the posture is able to reach the final posture Pt via another posture. Thus, the robot can suitably escape from the state where it cannot reach the current final posture Pt. In addition, since it is determined whether the way-point posture candidate is selected based on the probability value which decreases in proportion to the degree of deviation between the final posture Pt and the way-point posture candidate Pvc, the possibility that the way-point posture candidate Pvc of which the degree of deviation from the current posture Ps is smaller is selected as the way-point posture Pv increases. Thus, the robot can suitably escape from the state where it cannot reach the present final posture more appropriately.

Figure 10A:
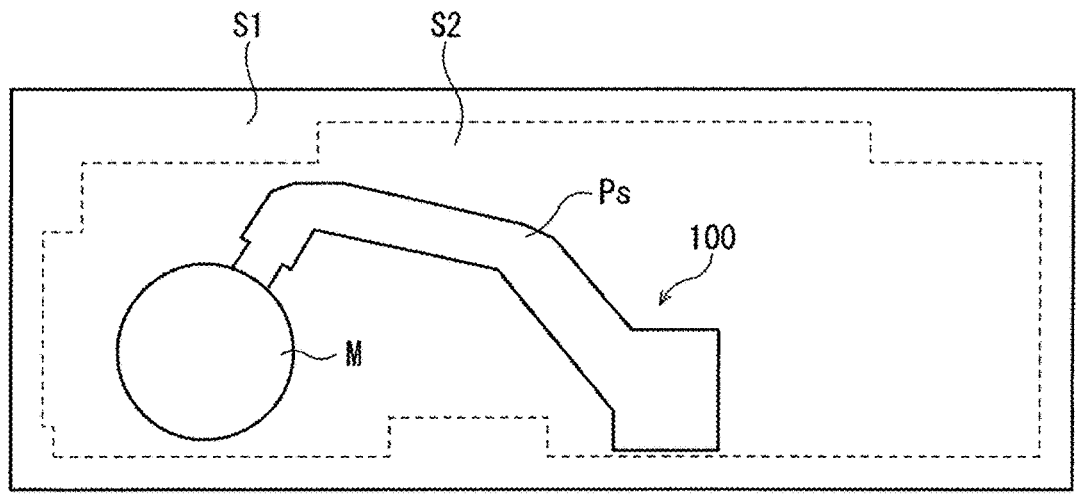
FIG. 10A is a view illustrating a simulation condition of the robot of FIG. 8.
Figure 10B:
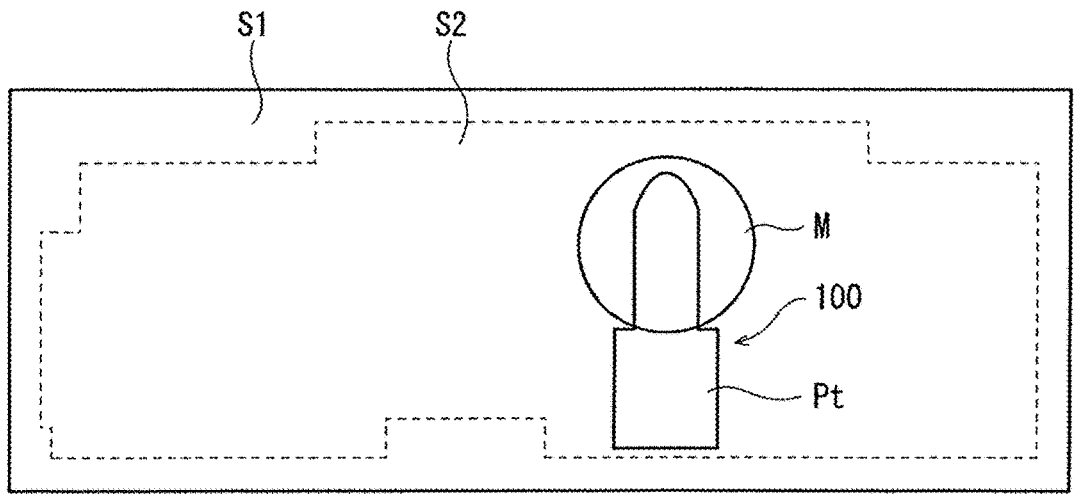
FIG. 10B is a view illustrating a simulation condition of the robot of FIG. 8.

FIGS. 10A and 10B are views illustrating a simulation condition of the robot 100 in the embodiment. As illustrated in FIG. 10A, the current posture Ps, the no-entry area S1, the operating area S2, and the geometric model M of the robot 100 are set. In addition, as illustrated in FIG. 10B, the final posture Pt of the robot 100 is set. Note that the teaching point of the hand in the final posture Pt is [x, y]=[0, 450].

Figure 10C:
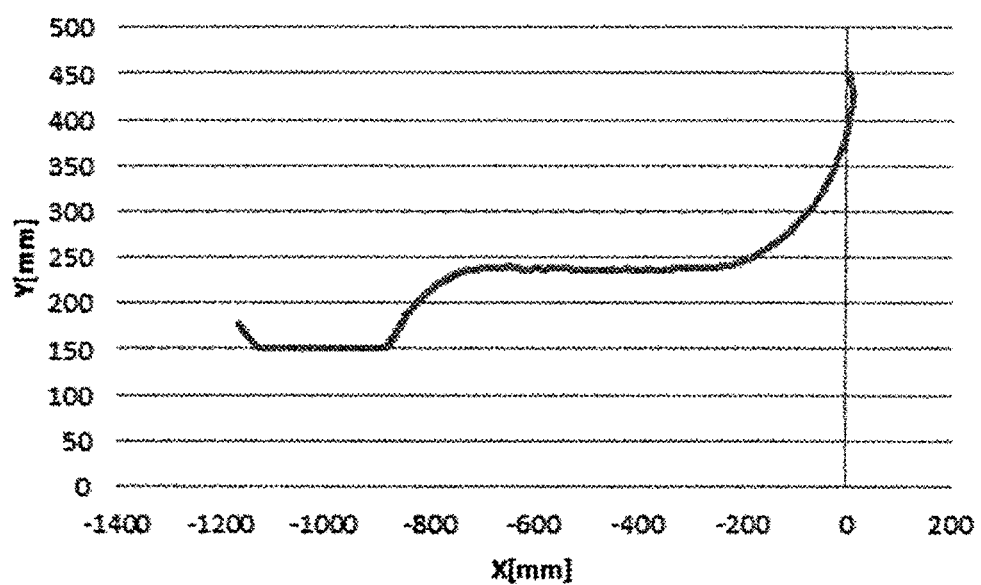
FIG. 10C is a view illustrating a simulation result of the robot of FIG. 8.

FIG. 10C is a view illustrating a simulation result of the robot 100, and is a view illustrating the locus of the hand. As illustrated in FIG. 10C, it can be seen that the robot 100 reaches the final posture Pt from the current posture Ps.

<Modifications>

In the embodiment described above, the robot 100 is constructed by the horizontally articulated robot, the geometric models are expressed in the xy-plane, and the determination of the existence of the interference in z-axis direction is not performed, but the embodiment is not limited to the configuration. Alternatively, the robot may be constructed with multiple perpendicular joints, geometric models may be expressed in three dimensions, and interference may be determined in three-dimensional space.

Moreover, in the embodiment described above, although the virtual posture calculator 36 calculates the virtual posture Pp of the robot 100, a virtual posture Pp of the geometric model of the robot 100 may be calculated instead.

It is apparent for a person skilled in the art of various improvements and other embodiments of the present invention with reference to the above description. Therefore, the above description is to be interpreted only as illustration, and is provided in order to teach a person skilled in the art with the best mode for implementing the present invention. The details of the structures (configurations) and/or the functions may substantially be changed without departing from the spirit of the present invention.

INDUSTRIAL APPLICABILITY

The present invention is applicable to industrial robots.

DESCRIPTION OF REFERENCE CHARACTERS

B Boundary Line
L1 Rotational Axis
L2 Rotational Axis
L3 Rotational Axis
M1 Geometric Model
M2 Geometric Model
M3 Geometric Model
Pp Virtual Posture
Ps Current Posture
Pt Final Posture
Ptc Final Posture Candidate
Pv Way-Point Posture
Pvc Way-Point Posture Candidate
S1 No-Entry Area
S2 Operating Area
Ta Initial Route
Tb Updated Route
1 Pedestal
2 First Arm
2a First Joint Shaft
3 Second Arm
3a Second Joint Shaft
4 Hand
4a Third Joint Shaft
5 Control Device
12 First Arm Actuator
13 Second Arm Actuator
14 Hand Actuator
15 First Arm Angular Position Detector
16 Second Arm Angular Position Detector
17 Hand Angular Position Detector
21 Controller
22 Memory
31 First Arm Controller
32 Second Arm Controller
33 Hand Controller
34 Final Posture Decider
35 Initial Route Decider
36 Virtual Posture Calculator
37 Geometric Model Expresser
38 Interference Determinator
39 Way-Point Posture Decider
40 Area Setter
41 Updated Route Decider
100 Robot
110 Facility

What is claimed is:

1. A method of automatically avoiding an obstacle for an arm robot having a robotic arm to which a plurality of links are coupled by joints and to which a hand is provided in a tip-end part thereof, comprising:

modeling the robot so as to have a geometric shape and expressing the model as a geometric model;

setting a no-entry area into which the geometric model is not to enter, and an operating area, that is defined by the no-entry area and where the geometric model operates;

deciding a final posture of the robot;

deciding an initial route of the hand when the robot changes from the current posture toward the final posture;

calculating a virtual posture of the robot corresponding to a given point on the initial route;

determining whether the geometric model in the virtual posture interferes with the no-entry area;

deciding, when the determining the interference determines that the geometric model does not interfere with the no-entry area, the virtual posture as a way-point posture, and when the determining the interference determines that the geometric model interferes with the no-entry area, virtually generating a repulsive force for relatively repelling an interfering portion of the geometric model from an interfering portion of the no-entry area, calculating a posture in a state where the interfering portion of the geometric model is pushed out from the no-entry area into the operating area by the virtual repulsive force, and deciding the calculated posture as a way-point posture;

deciding a route of the hand when the posture changes from the current posture to the final posture via the way-point posture, as an updated route; and repeatedly performing the deciding the initial route, the calculating the virtual posture, the determining the interference, the deciding the way-point posture, and the deciding the updated route, under an assumption of the latest way-point posture decided in the deciding the way-point posture being the current posture in the deciding the initial route.

2. The method of claim 1, wherein the deciding the final posture includes selecting from the plurality of final posture candidates of the robot set on a known route and deciding as the final posture, a final posture candidate of which a sum total of absolute values of displacements in an angle of each of the joints between the current posture and the final posture candidate of the robot is minimum.

3. The method of claim 1, wherein the deciding the way-point posture includes:

calculating a torque produced by the virtual repulsive force on a rotational shaft of each of the joints of the robot in a certain virtual posture;

further calculating a change with time of the virtual posture of the robot by repeatedly performing a calculation of the virtual posture of the robot after a given period of time that changes due to an influence of the torque, by using the virtual posture as the origin; and deciding the way-point posture based on the virtual posture of the robot when the change with time of the virtual posture of the robot is converged.

4. The method of claim 1, wherein the virtual repulsive force increases in proportion to a distance of the geometric model entering into the no-entry area.

5. The method of claim 1, comprising:

determining whether the change with time of the posture of the robot does not approach the final posture, and the posture falls into a halt state;

generating, when the posture is determined to fall into the halt state in the determining the halt state, a way-point posture candidate other than the posture in the state where the model is pushed out by the virtual repulsive force of the robot;

firstly determining whether the way-point posture candidate is a posture that approaches the final posture; and firstly deciding, when the way-point posture candidate is determined to be the posture that changes in a direction approaching the final posture in the first determination, the way-point posture based on the way-point posture candidate.

6. The method of claim 5, comprising:

secondly determining, when the way-point posture candidate is determined to be a posture that changes in a direction of separating from the final posture in the first determination, whether the way-point posture candidate is selected based on a probability value; and secondly deciding, when the way-point posture candidate is determined to be selected in the second determination, the way-point posture based on the selected way-point posture candidate.

7. A control device of an arm robot having a robotic arm to which a plurality of links are coupled by joints and to which a hand is provided in a tip-end part thereof, comprising:

a geometric model expresser configured to model the robot so as to have a geometric shape and express the model as a geometric model;

an area setter configured to set a no-entry area into which the geometric model is not to enter, and an operating area, that is defined by the no-entry area and where the geometric model operates;

a final posture decider configured to decide a final posture of the robot;

an initial route decider configured to decide an initial route of the hand when the robot changes from the current posture toward the final posture;

a virtual posture calculator configured to calculate a virtual posture of the robot corresponding to a given point on the initial route;

an interference determinator configured to determine whether the geometric model in the virtual posture interferes with the no-entry area;

a way-point posture decider configured to decide a way-point posture; and an updated route decider, wherein the way-point posture decider decides, when the interference determinator determines that the geometric model does not interfere with the no-entry area, the virtual posture as the way-point posture, and when the interference determinator determines that the geometric model interferes with the no-entry area, the way-point posture decider virtually generates a repulsive force for relatively repelling an interfering portion of the geometric model from an interfering portion of the no-entry area, and the way-point posture decider calculates a posture in a state where the interfering portion of the geometric model is pushed out from the no-entry area into the operating area by the virtual repulsive force, and decides the calculated posture as the way-point posture, wherein the updated route decider decides a route of the hand when the posture changes from the current posture to the final posture via the way-point posture, as an updated route, and wherein the initial route decider, the virtual posture calculator, the interference determinator, the way-point posture decider, and the updated route decider process repeatedly under an assumption of the latest way-point posture decided by the way-point posture decider being the current posture of the initial route decider.

* * * * *